(12) United States Patent
Hsu et al.

(10) Patent No.: US 9,241,422 B2
(45) Date of Patent: *Jan. 19, 2016

(54) MULTIDIRECTIONAL SUPPORT STRUCTURE FOR TABLET DISPLAY APPARATUS

(71) Applicant: FIRST DOME CORPORATION, New Taipei (TW)

(72) Inventors: An Szu Hsu, New Taipei (TW); Chien Yu Lin, New Taipei (TW)

(73) Assignee: First Dome Corporation, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/277,280

(22) Filed: May 14, 2014

(65) Prior Publication Data

US 2014/0291458 A1  Oct. 2, 2014

Related U.S. Application Data

(62) Division of application No. 13/457,678, filed on Apr. 27, 2012, now Pat. No. 8,934,232.

(30) Foreign Application Priority Data

Jan. 17, 2012  (TW) .............................. 101101848 A

(51) Int. Cl.
| | |
|---|---|
| *F16M 11/06* | (2006.01) |
| *H05K 7/18* | (2006.01) |
| *G06F 1/16* | (2006.01) |
| *F16M 11/04* | (2006.01) |

(52) U.S. Cl.
CPC ............... *H05K 7/18* (2013.01); *F16M 11/041* (2013.01); *F16M 11/043* (2013.01); *G06F 1/1626* (2013.01); *G06F 1/1637* (2013.01); *G06F 1/1654* (2013.01); *G06F 1/1662* (2013.01); *F16M 11/06* (2013.01)

(58) Field of Classification Search
USPC ............. 361/679.04, 679.06, 679.07, 679.27, 361/679.3, 679.56, 923, 922, 921, 919; 248/448, 447, 454, 457, 458, 460, 133, 248/136, 150, 371, 162.1; 40/757

See application file for complete search history.

(56) References Cited

U.S. PATENT DOCUMENTS

| | | | | |
|---|---|---|---|---|
| 7,384,019 | B2* | 6/2008 | Choi .............................. | 248/136 |
| 7,593,218 | B2* | 9/2009 | Hwang et al. ............ | 361/679.21 |
| 7,597,302 | B2* | 10/2009 | Lee et al. ...................... | 248/371 |
| 7,628,365 | B2* | 12/2009 | Lee .......................... | 248/297.21 |
| 7,789,363 | B2* | 9/2010 | Duan ......................... | 248/284.1 |
| 7,819,368 | B2* | 10/2010 | Jung et al. ..................... | 248/133 |

(Continued)

*Primary Examiner* — Alfred J Wujciak

(74) *Attorney, Agent, or Firm* — Rosenberg, Klein & Lee

(57) ABSTRACT

A multidirectional support structure for tablet display apparatus includes a support member having a first end section and a second end section opposite to the first end section. The first end section is pivotally connected with an angle adjustment seat. The angle adjustment seat is further pivotally connected with a rotatable connection assembly. The connection assembly is formed with a receiving space for receiving the tablet display apparatus. The second end section of the support member is pivotally connected with one side of a base seat. The other side of the base seat is pivotally connected with a board body. The board body can be connected with multiple press keys as necessary to form a keyboard. Accordingly, the tablet display apparatus can be co-used with the keyboard and rotated and tilted by different angles and supported in different inclined positions.

10 Claims, 12 Drawing Sheets

(56) References Cited

U.S. PATENT DOCUMENTS

| | | | |
|---|---|---|---|
| 7,916,468 B2* | 3/2011 | Takizawa | 361/679.44 |
| 8,061,663 B2* | 11/2011 | Wang et al. | 248/162.1 |
| 8,464,995 B2* | 6/2013 | Yang et al. | 248/455 |
| 8,498,101 B2* | 7/2013 | Chiang et al. | 361/679.22 |
| 8,520,371 B2* | 8/2013 | Peng et al. | 361/679.01 |
| 8,607,976 B2* | 12/2013 | Wu et al. | 206/320 |
| 8,611,076 B2* | 12/2013 | Wetzel et al. | 361/679.06 |
| 8,934,232 B2* | 1/2015 | Hsu et al. | 361/679.27 |
| 9,027,747 B2* | 5/2015 | Hsu et al. | 206/45.2 |
| 2005/0029414 A1* | 2/2005 | Jeong | 248/122.1 |
| 2006/0038104 A1* | 2/2006 | Choi | 248/370 |
| 2006/0138298 A1* | 6/2006 | Yuan | 248/371 |
| 2008/0266768 A1* | 10/2008 | Drew | 361/681 |
| 2010/0073857 A1* | 3/2010 | Lin et al. | 361/679.27 |
| 2010/0123053 A1* | 5/2010 | Wang | 248/125.1 |

* cited by examiner

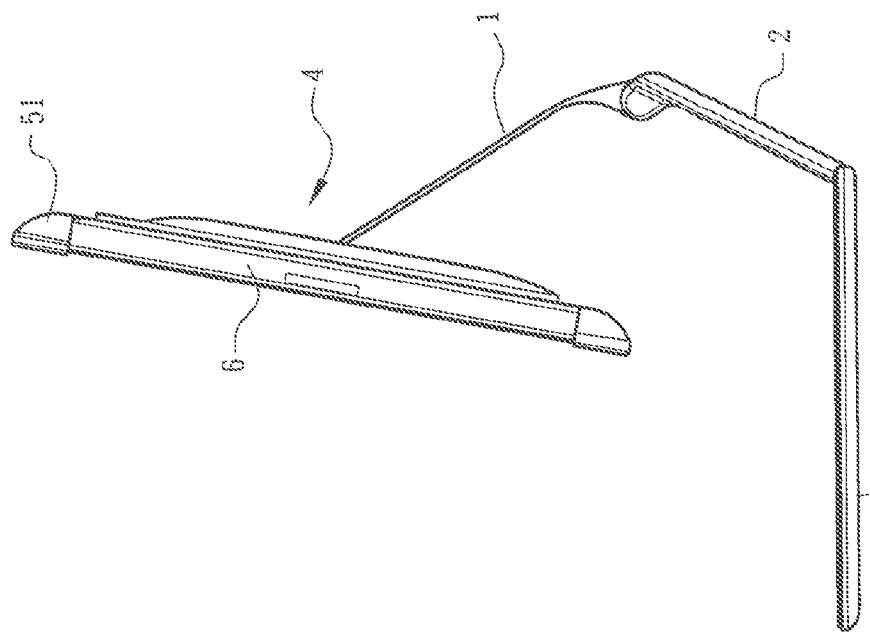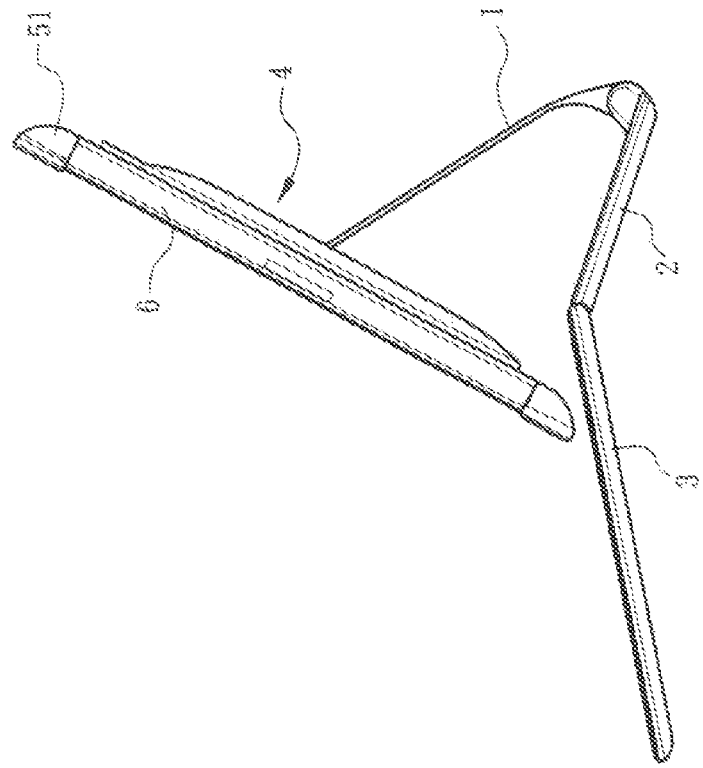

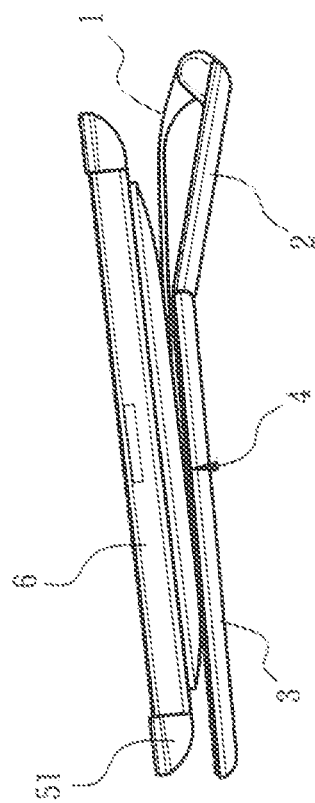

MULTIDIRECTIONAL SUPPORT STRUCTURE FOR TABLET DISPLAY APPARATUS

REFERENCE TO RELATED APPLICATION

This Application is being filed as a Divisional Application of Ser. No. 13/457,678, filed 27 Apr. 2012, currently pending.

BACKGROUND OF THE INVENTION

1. Field of the Invention

The present invention relates generally to a multidirectional support structure for tablet display apparatus, and more particularly to a multidirectional support structure for tablet display apparatus, by means of which a user can tilt and rotate the tablet display apparatus by different angles to adjust the angular position of the tablet display apparatus. In addition, as necessary, the multidirectional support structure is connectable with different board bodies with different functions in adaptation to different situations and requirements.

2. Description of the Related Art

There are various conventional support structures and protection jacket structures for tablet computers. Such prior art discloses a support structure for tablet computer. The support structure is mainly composed of a fixing board body and a support member pivotally connected with the fixing board body. The fixing board body includes a front cover and a rear cover connected with the front cover. The rear cover has multiple locating members extending from the rear cover to the front cover. The rear cover is connected with multiple holding boards. Each holding board is formed with a guide slot for the locating member to slide along. The locating member provides a restriction effect for the guide slot so as to limit the holding board to move within a certain range. In addition, an extensible member is disposed at the guide slot for the holding board to abut against and hold the tablet computer. Accordingly, by means of the extensible members, the holding boards can securely hold different sizes of tablet computers. However, the above structure can only hold and support the tablet computer in a fixed angular viewing position. Therefore, the application of the support structure cannot be diversified to meet various use requirements.

Another prior art discloses a support box structure for tablet computer. The support box structure includes a box body with a shutter box cover. The box body has a receiving cavity in which a Bluetooth wireless transmission keyboard can be snugly inserted. The box cover has an interlayer. A base shaft of the interlayer is pivotally connected with a support board. A rear shaft of the support board is pivotally connected with a support leg. When the box cover is stretched and horizontally rested, the support leg supports the support board to extend by an inclination for placing the tablet computer thereon. Accordingly, the tablet computer can be placed on a desktop and conveniently used in adaptation to the operation mode of a user who is familiar with solid keyboard. By means of such structure, the tablet computer can be supported by different inclination angles. However, the keyboard cannot be tilted to facilitate the operation. Moreover, it is still uneasy to operation the tablet computer to provide transverse display effect. As a result, the use of the tablet computer is still limited.

Further, another prior art discloses a protection jacket for tablet computer. The protection jacket includes an upper cover and a base seat. A second turn section is formed between the upper cover and the base seat, whereby the upper cover and the base seat can be folded onto each other. A first turn section is formed near the middle of the base seat, whereby the base seat can be folded by a certain angle. Several magnets are disposed in the upper cover at intervals. According to the above arrangement, the tablet computer can be affixed to the base seat. The iron core inbuilt and concealed in the periphery of the tablet computer and the magnets of the upper cover can attract each other. In addition, the first and second turn sections can be folded so that the iron core can be attracted by different magnets in different positions, whereby the viewing angle of the tablet computer can be adjusted. Moreover, the protection jacket serves to protect the tablet computer from being scraped. By means of the above structure, the tablet computer can be supported by different inclination angles. However, the protection jacket cannot be connected with a keyboard.

It is therefore tried by the applicant to provide a multidirectional support structure for tablet display apparatus to overcome the shortcomings existing in the conventional support structures and protection jacket structures for tablet computers.

SUMMARY OF THE INVENTION

It is therefore a primary object of the present invention to provide a multidirectional support structure for tablet display apparatus. By means of the multidirectional support structure, a user can tilt the screen of the tablet display apparatus by different angles and locate the tablet display apparatus in different angular positions to diversify the application of the tablet display apparatus for meeting various viewing requirements.

It is a further object of the present invention to provide the above multidirectional support structure for tablet display apparatus, which is connectable with a board body with keyboard function. The board body can be raised and supported in an inclined position to meet the ergonomic requirement and facilitate the use of the tablet display apparatus.

To achieve the above and other objects, the multidirectional support structure for tablet display apparatus of the present invention includes a support member, a base seat and aboard body. The support member has a first end section and a second end section opposite to the first end section. The first end section is connected to the tablet display apparatus. The base seat is pivotally connected to the second end section of the support member via a first pivot member with pivotally locating function. The board body is pivotally connected to one side of the base seat via a second pivot member with pivotally locating function, which side is distal from the support member.

In the above multidirectional support structure for tablet display apparatus, an angle adjustment seat and a connection assembly are disposed between the first end section of the support member and the tablet display apparatus. The angle adjustment seat is pivotally connected with the first end section of the support member via at least one third pivot member. The angle adjustment seat is formed with a receiving section with an opening. At least one engagement locating member is disposed in the receiving section. The engagement locating member is constantly outward elastically pushed by a preset elastic member. The connection assembly is relatively rotatably connected to one side of the angle adjustment seat, which side is formed with the receiving section. The connection assembly has a hollow section corresponding to the receiving section. An inner periphery of the hollow section is formed with multiple locating recesses for the engagement locating member to elastically engage in. The connection assembly is formed with a receiving space for receiving the tablet display apparatus.

In the above multidirectional support structure for tablet display apparatus, the connection assembly includes a fixing seat. The receiving space is formed on the fixing seat.

In the above multidirectional support structure for tablet display apparatus, the connection assembly further includes a retainer member. The hollow section is formed on the fixing seat. The fixing seat is connected to the angle adjustment seat by means of the retainer member.

In the above multidirectional support structure for tablet display apparatus, the connection assembly further includes a connection member. The hollow section is formed on the connection member. The connection member is connected to the angle adjustment seat by means of a retainer member. The fixing seat is detachably connected to the connection member.

In the above multidirectional support structure for tablet display apparatus, a first edge of the connection member is formed with at least one first locating section and a second edge of the connection member opposite to the first edge is formed with at least one second locating section. The fixing seat is formed with at least one first located section and at least one second located section corresponding to the first and second locating sections respectively.

In the above multidirectional support structure for tablet display apparatus, the first and second locating sections are hook section and hook structure respectively, while the first and second located sections are located guide slot and engagement guide slot respectively.

In the above multidirectional support structure for tablet display apparatus, at least one guide way is disposed on a periphery of the receiving section for guiding the engagement locating member to move along the guide way.

In the above multidirectional support structure for tablet display apparatus, a bottom side of the receiving section is formed with at least one passage in communication with a backside of the receiving section. The third pivot member is disposed in the receiving section. The third pivot member has a pivot end with pivotally locating function. The pivot end passes through the passage to connect with the first end section of the support member.

In the above multidirectional support structure for tablet display apparatus, a locating section is disposed between the passage and the guide way for fixing one end of the elastic member. The other end of the elastic member serves to push the engagement locating member.

In the above multidirectional support structure for tablet display apparatus, the base seat is formed with a pivot dent for receiving the second end section of the support member. An outer periphery of the second end section is formed with an abutment section for abutting against a bottom face of the pivot dent in pivotal rotation of the support member.

In the above multidirectional support structure for tablet display apparatus, the board body is connected with multiple press keys to form a keyboard structure.

The present invention can be best understood through the following description and accompanying drawings, wherein:

BRIEF DESCRIPTION OF THE DRAWINGS

FIG. 9 is a side view showing the use of the tablet display apparatus, which is supported in an upright position;

FIG. 10 is a side view according to FIG. 9, showing the use of the tablet display apparatus, in which the base seat and the board body contains an angle;

FIG. 11 is a side view of the first embodiment of the present invention, showing the use of the tablet display apparatus, in which the fixing seat overlaps the board body with the screen of the tablet display apparatus facing upward;

DETAILED DESCRIPTION OF THE PREFERRED EMBODIMENTS

Figure 1:
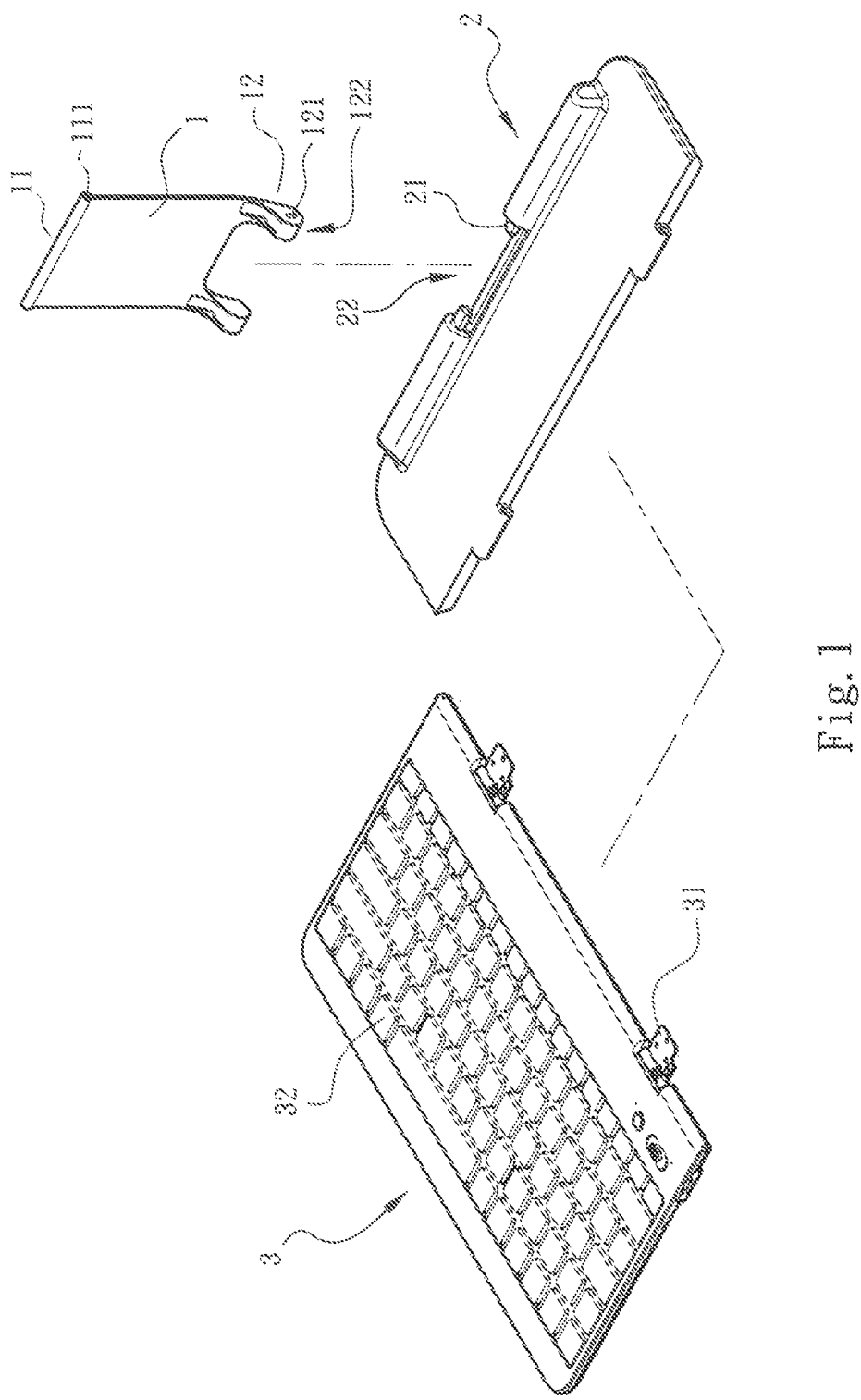
FIG. 1 is a perspective exploded view of the present invention.

Please refer to FIG. 1. The multidirectional support structure for tablet display apparatus of the present invention includes a support member 1, a base seat 2 and a board body 3. The support member 1 has a first end section 11 and a second end section 12 opposite to the first end section 11. The first end section 11 serves to connect with a tablet display apparatus 6. The second end section 12 serves to connect with the base seat 2. Two sides of the first end section 11 are respectively formed with two shaft holes 111. Two sides of the second end section 12 are respectively formed with two shaft holes 121. An outer periphery of the second end section 12 is formed with an abutment section 122.

The base seat 2 is formed with a pivot dent 22 for receiving the second end section 12 of the support member 1. Two first pivot members 21 with pivotally locating function are respectively disposed on two inner opposite sides of the pivot dent 22. The first pivot members 21 are pivotally connectable in the shaft holes 121 of the support member 1. Accordingly, the support member 1 can be pivotally rotated relative to the base seat 2 and located in a desired angular position. Also, when the support member 1 is pivotally rotated, the abutment section 122 of the support member 1 serves to abut against a bottom face of the pivot dent 22 so as to restrict the pivotally rotational angle of the support member 1 relative to the base seat 2.

The board body 3 is pivotally connected to one side of the base seat 2 via multiple second pivot members 31 with pivotally locating function, which side is distal from the support member 1. The board body 3 can be an ordinary board body structure for resting articles thereon. Alternatively, the board body 3 can be connected with multiple press keys 32 to form a keyboard structure.

Figure 2:
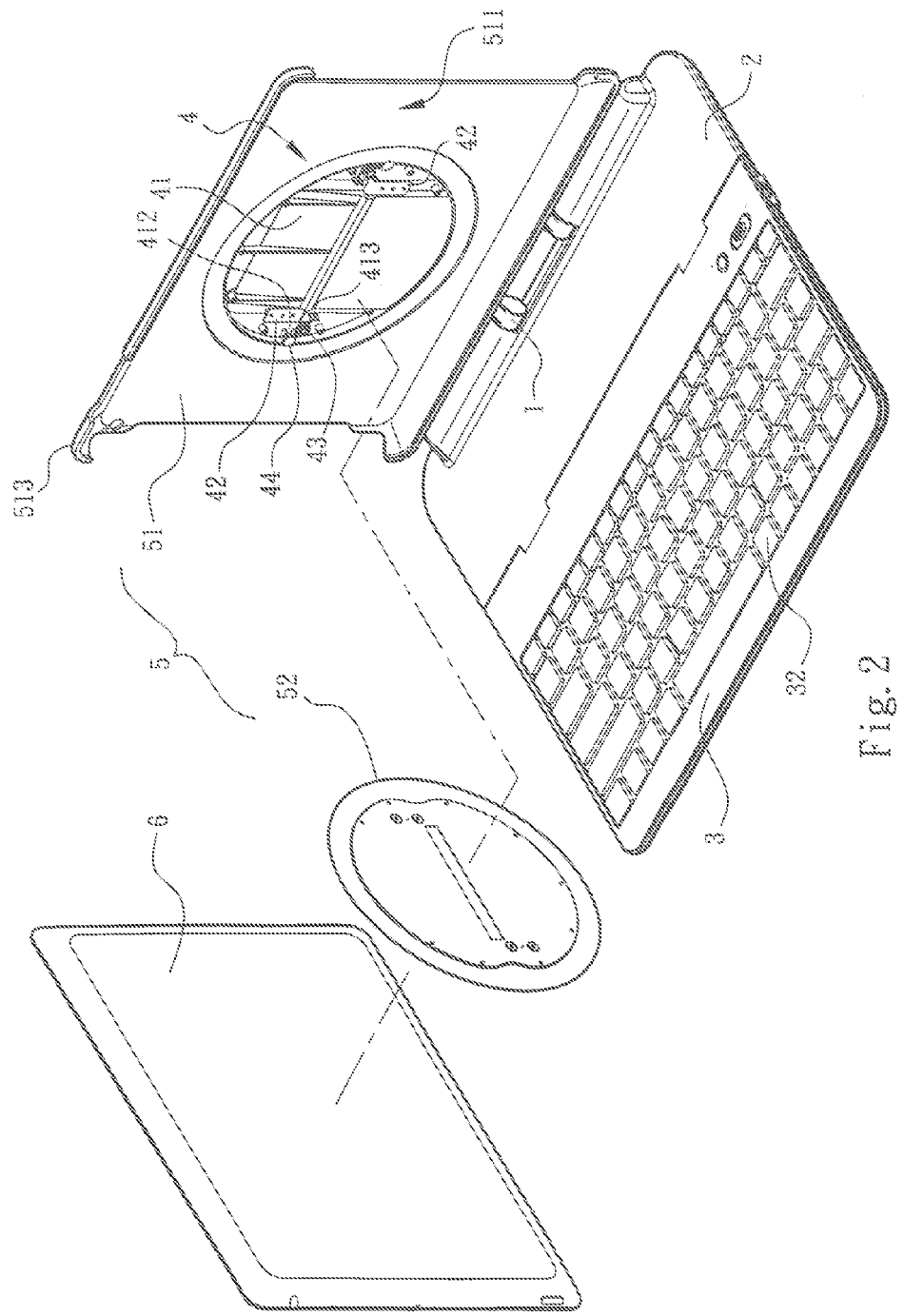
FIG. 2 is a perspective partially assembled view of a first embodiment of the present invention.
Figure 3:
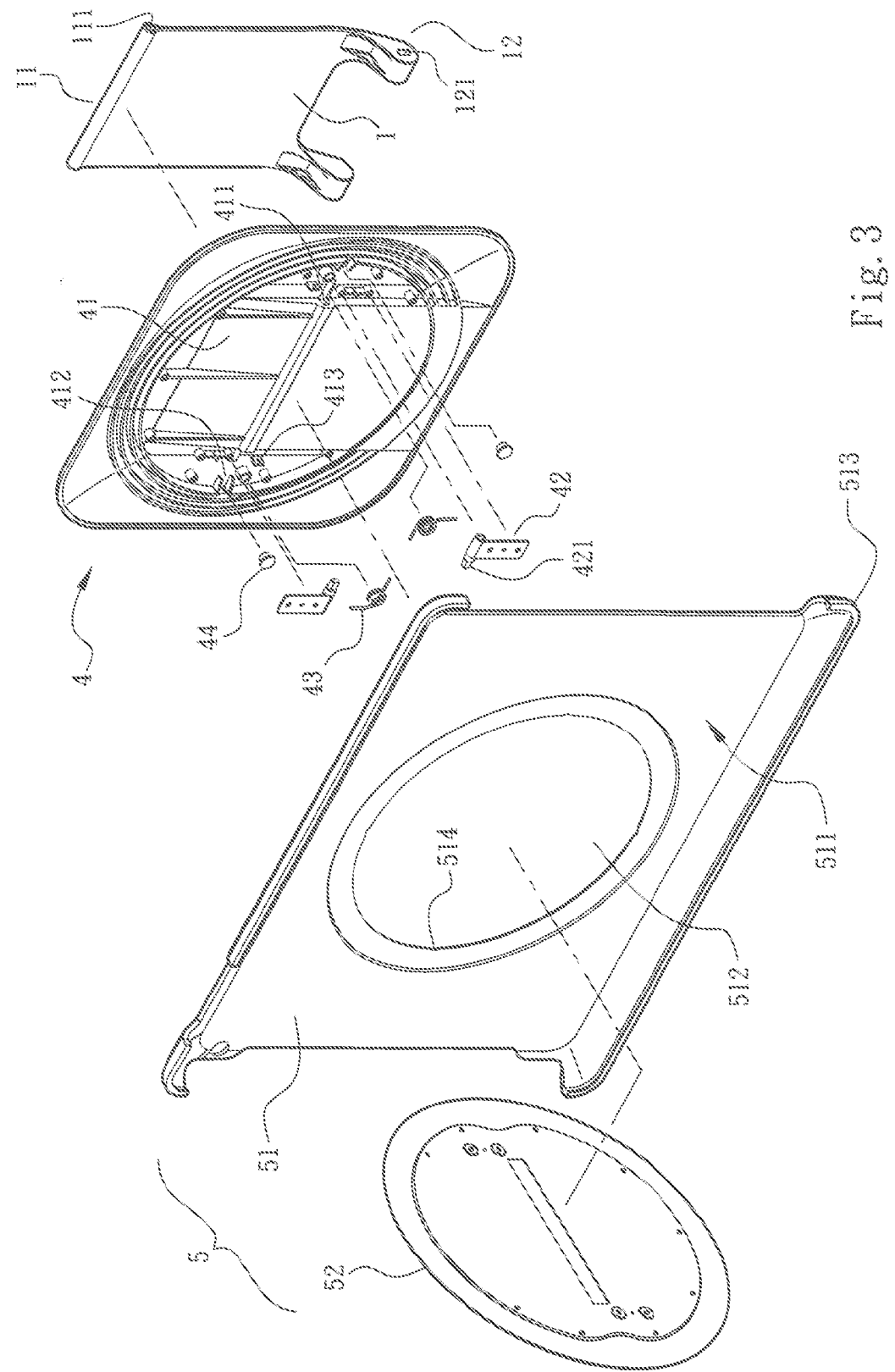
FIG. 3 is a perspective exploded view of the angle adjustment seat and the connection assembly of the first embodiment of the present invention.
Figure 4:
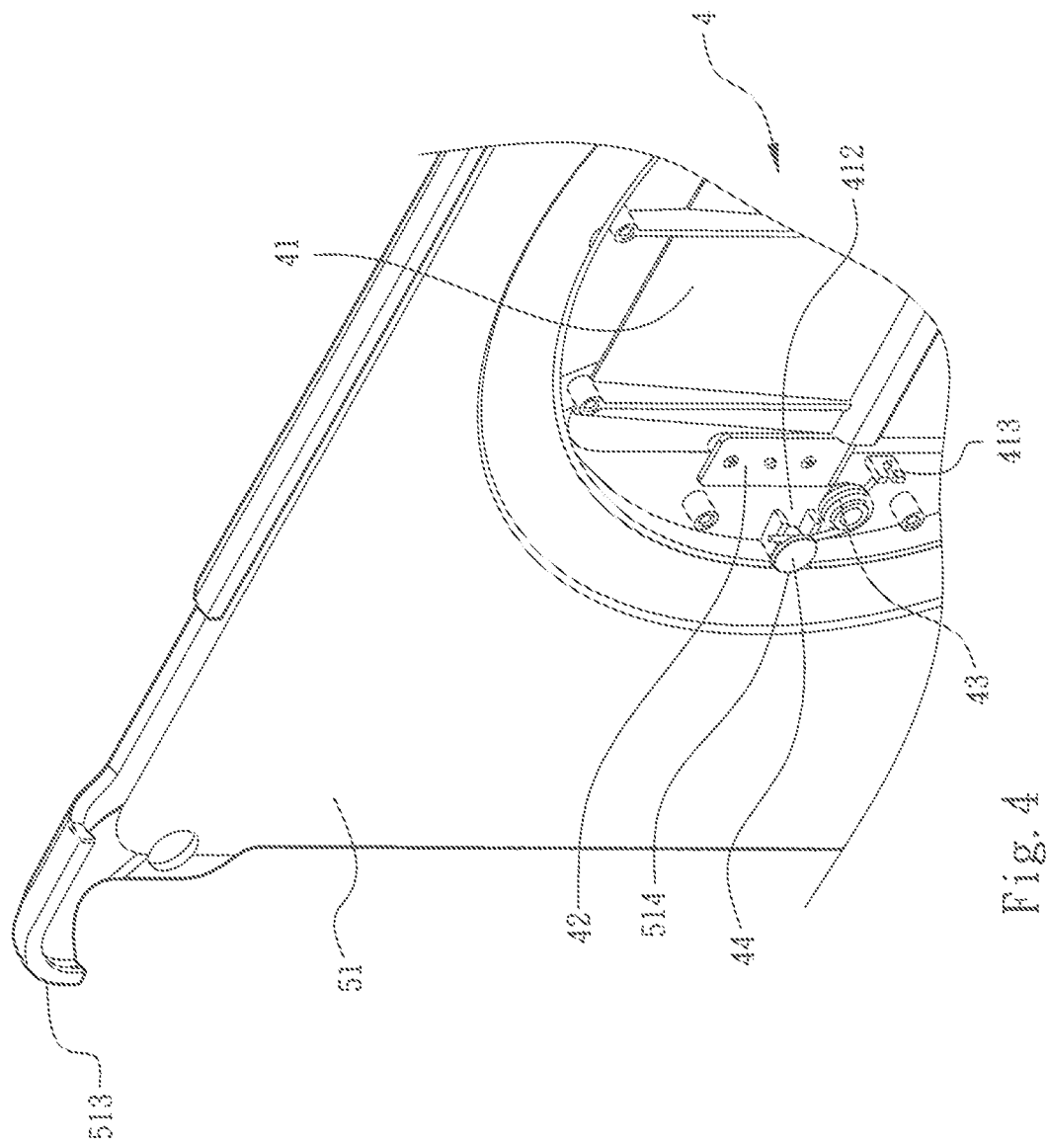
FIG. 4 is a perspective assembled view of the angle adjustment seat of the first embodiment of the present invention, showing the internal structure of the angle adjustment seat.

Please now refer to FIGS. 2 to 4. In practice, according to a first embodiment, the present invention can further include an angle adjustment seat 4 and a connection assembly 5 in cooperation with the support member 1. A center of the angle adjustment seat 4 is formed with a receiving section 41 with an opening. A bottom side of the receiving section 41 is formed with transversely extending passages 411 in communication with a backside of the receiving section 41. Two guide ways 412 are respectively disposed on outer sides of the passages 411. A locating section 413 is disposed between each passage 411 and each guide way 412. Two third pivot members 42 are respectively disposed beside the passages 411. Each third pivot member 42 has a pivot end 421 with pivotally locating function. The pivot ends 421 respectively pass through the passages 411 to connect with the shaft holes 111 of the support member 1. Accordingly, the angle adjustment seat 4 can be pivotally rotated and tilted around the first end section 11 of the support member 1 and located in a desired angular position. Two elastic members 43, (which can be coiled springs), are respectively arranged between the locating sections 413 and the guide ways 412. Each elastic member 43 has a first end affixed to the locating section 413 and a second end extending into the guide way 412 for constantly elastically urging an engagement locating member 44, (which can be a roller), to move outward.

The connection assembly 5 is composed of a fixing seat 51 and a retainer member 52. One side of the fixing seat 51 is formed with a receiving space 511 for receiving a tablet display apparatus 6 (such as a tablet computer or a cellular phone). The periphery of the receiving space 511 is formed with a protruding holding section 513 for locating the tablet display apparatus 6. A center of the fixing seat 51 (the receiving space 511) is formed with a hollow section 512 corresponding to the receiving section 41. An inner periphery of the hollow section 512 is formed with multiple locating recesses 514 arranged at predetermined angular intervals. The engagement locating members 44 can be elastically engaged and located in the locating recesses 514 (as shown in FIG. 4). The retainer member 52 has an area larger than that of the hollow section 512 and is connected to one side of the fixing seat 51, which side is distal from the angle adjustment seat 4. The retainer member 52 covers the hollow section 512 to prevent the third pivot members 42, the elastic members 43 and the engagement locating members 44 from outward loosening and detaching from the angle adjustment seat 4. Also, the retainer member 52 serves to connect the fixing seat 51 onto the angle adjustment seat 4, permitting the fixing seat 51 to be rotated relative to the angle adjustment seat 4.

Figure 7:
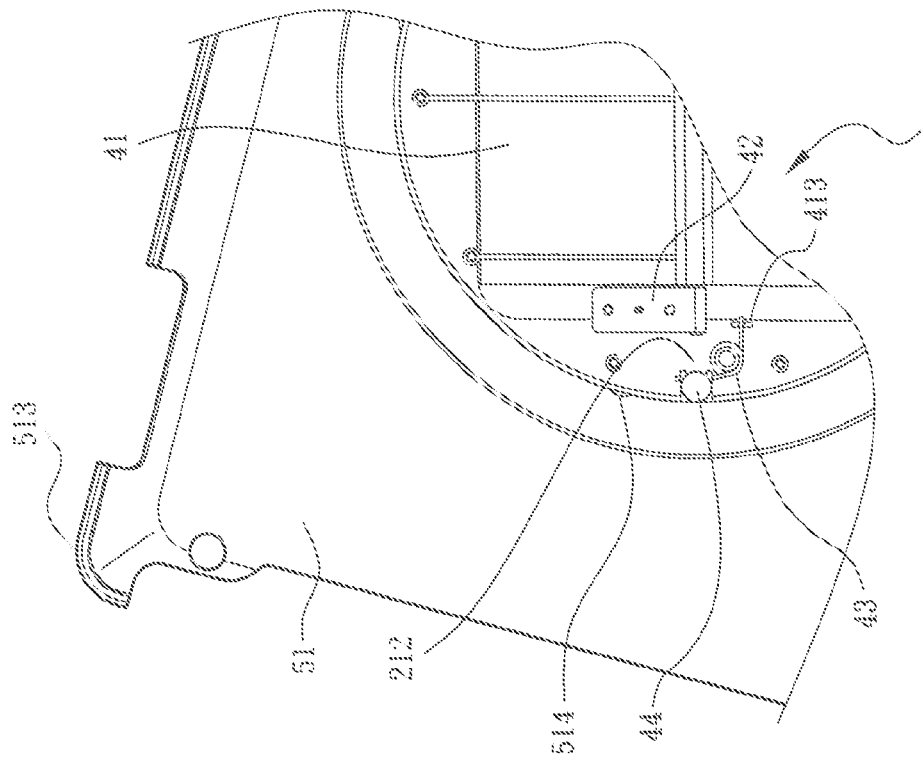
FIG. 7 shows that the connection assembly of the first embodiment of the present invention is rotated to disengage the engagement locating member from the locating recess as shown in FIG. 5.
Figure 5:
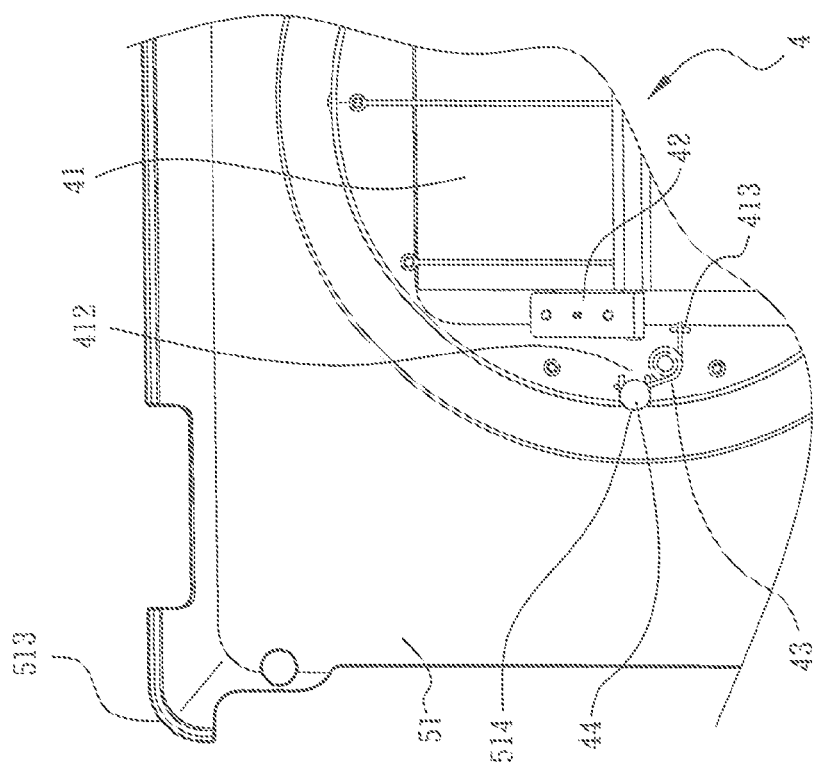
FIG. 5 shows that the engagement locating member of the angle adjustment seat of the first embodiment of the present invention is engaged in a predetermined locating recess in an initial position.
Figure 6:
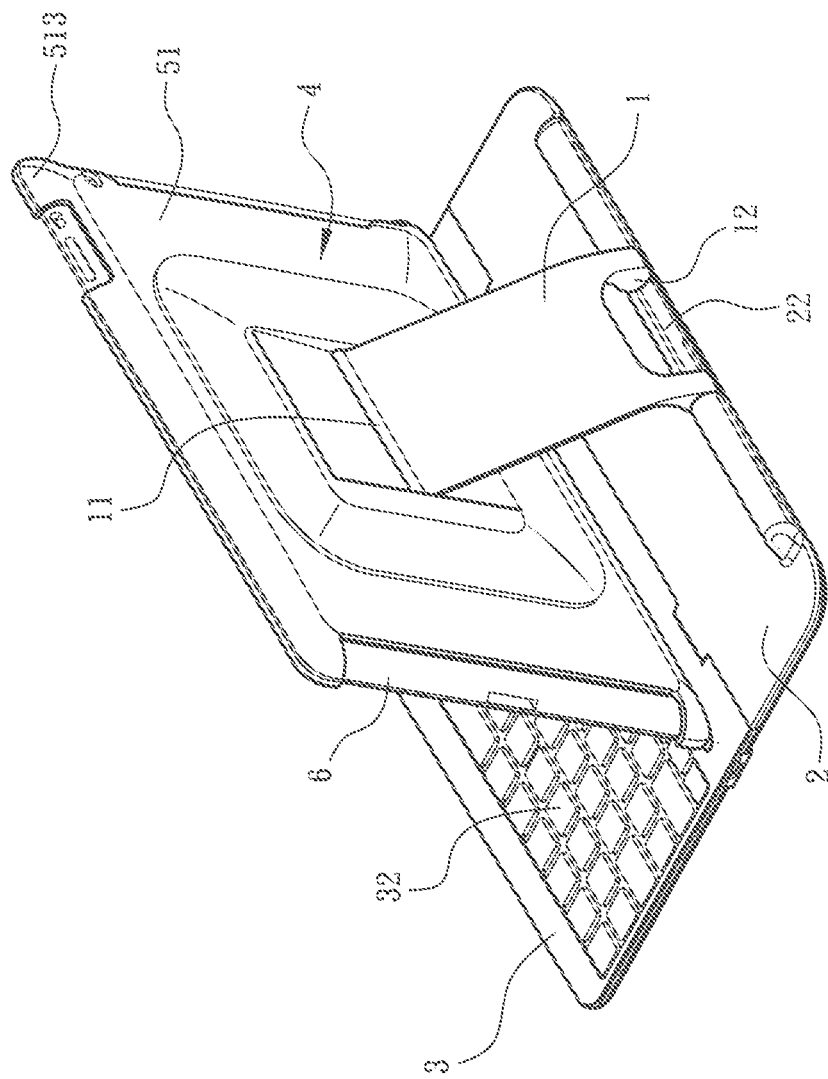
FIG. 6 is a perspective view showing the use of the tablet display apparatus according to FIG. 5.
Figure 8:
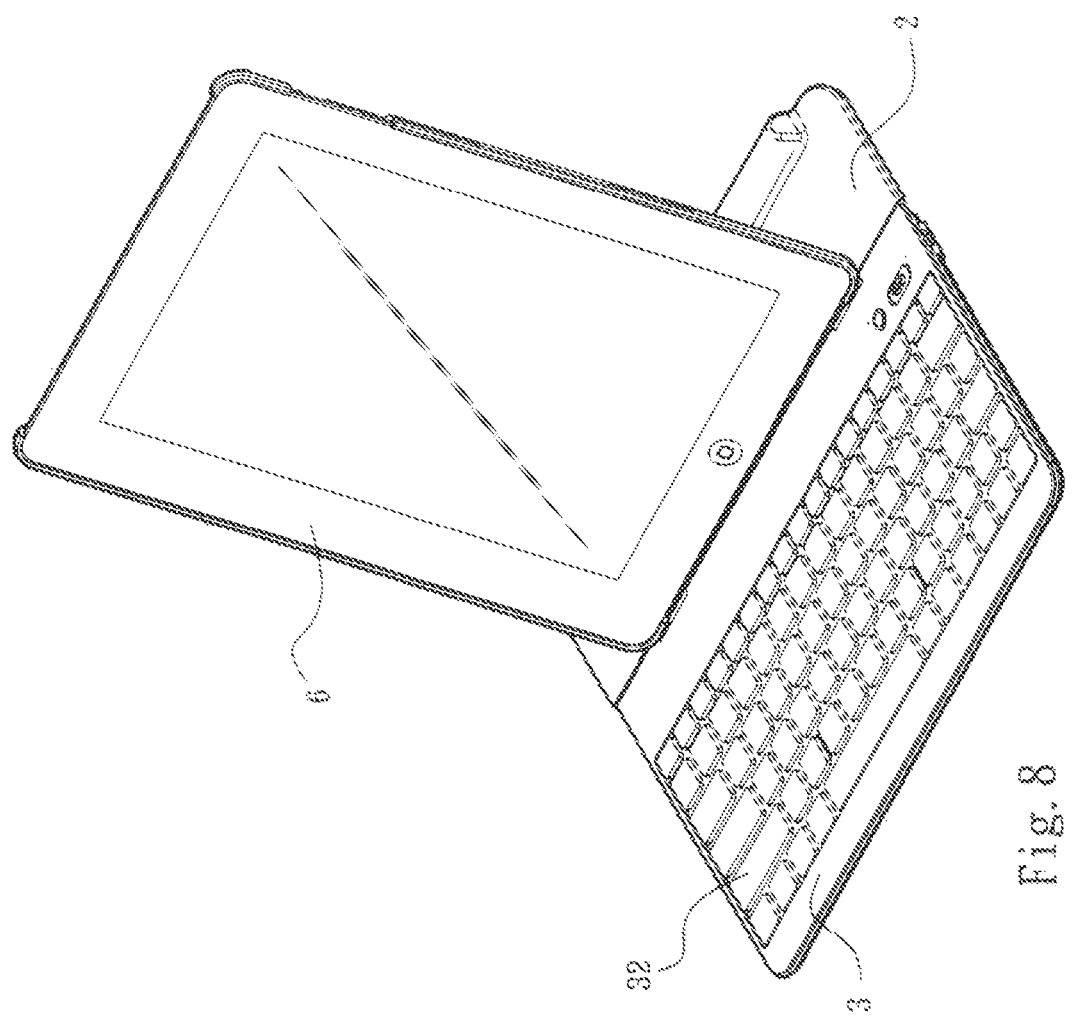
FIG. 8 is a perspective view showing the use of the tablet display apparatus, which is 90-degree rotated from the position of FIG. 6 to an upright position.
Figure 12:
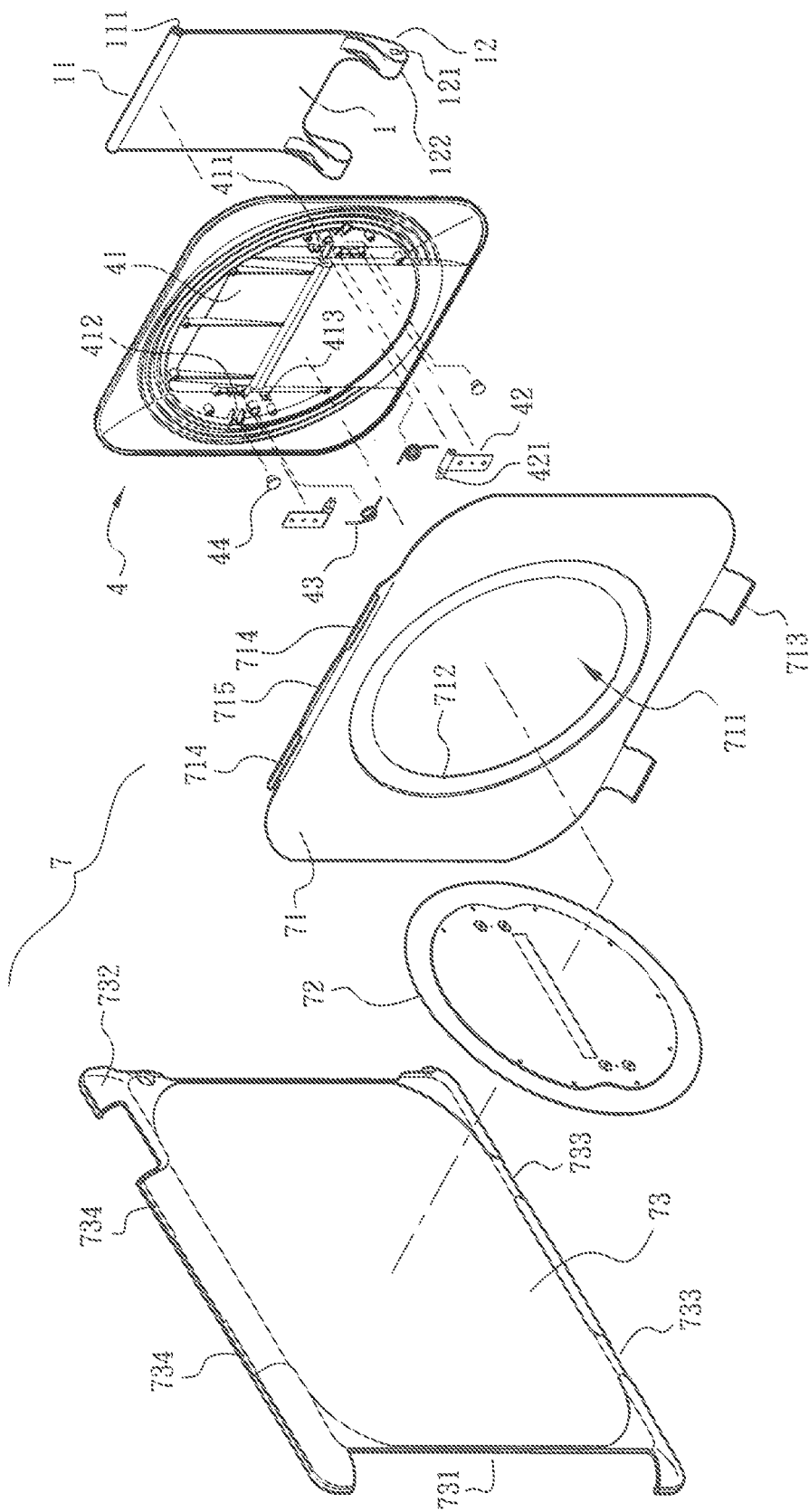
FIG. 12 is a perspective exploded view of a second embodiment of the present invention.
Figure 13:
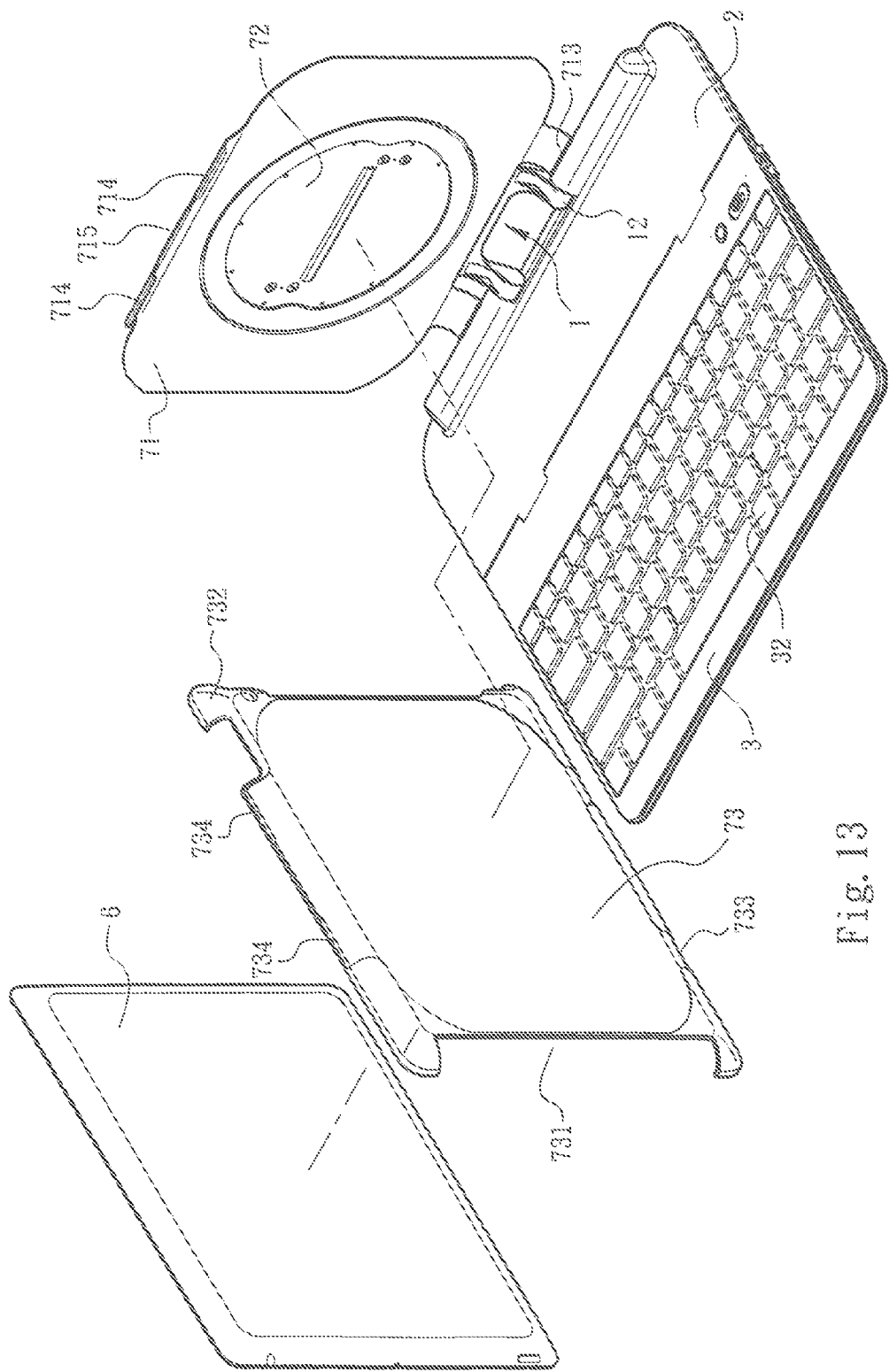
FIG. 13 is a perspective partially assembled view of the second embodiment of the present invention.

Please now refer to FIGS. 5 to 11. In use of the first embodiment of the present invention, the engagement locating members 44 of the angle adjustment seat 4 are engaged in the locating recesses 514 formed on the periphery of the hollow section 512 of the fixing seat 51 as in an initial position (as shown in FIG. 5). Under such circumstance, the fixing seat 51 with the tablet display apparatus 6 is positioned in a transverse position (as shown in FIG. 6). When an external force is applied to the fixing seat 51 (or the tablet display apparatus 6) to rotate the fixing seat 51, the engagement locating members 44 twist the elastic members 43 and disengage from the original locating recesses 514 (as shown in FIG. 7) to move along the inner periphery of the hollow section 512 until the engagement locating members 44 are engaged and located in the other locating recesses 514. At this time, the fixing seat 51 is released from the external force, whereby the fixing seat 51 with the tablet display apparatus 6 is positioned in a non-transverse angular position. Accordingly, the tablet display apparatus 6 can be rotated by different angles and located in different angular positions in adaptation to different use situations and requirements. (FIG. 8 shows that the tablet display apparatus 6 is 90-degree rotated and positioned in a vertical position).

When not used and it is desired to store the tablet display apparatus 6, the support member 1 can be pivotally rotated to make the screen side of the tablet display apparatus 6 attach to and overlap the board body 3 so as to minimize the occupied room for easy storage or carriage and provide a protection effect for the screen of the tablet display apparatus 6.

When it is desired to use the tablet display apparatus 6 in a normal state, the support member 1 can be pivotally rotated in a reverse direction to make the tablet display apparatus 6 positioned in an upright position or tilted by a certain angle for a user to easily watch the screen. In the meantime, the angle contained between the board body 3 and the base seat 2 can be varied. For example, the board body 3 can solely contact a preset plane face (such as a desktop) with the base seat 2 and the support member 1 folded by a certain angle, whereby the tablet display apparatus 6 is supported in a suitable angular position for easy watch or operation (as shown in FIG. 9). Alternatively, the base seat 2 and the board body 3 can be folded by a certain angle to make the pivoted sections thereof rise from the plane face. In this case, the other sides of the base seat 2 and the board body 3, which sides are distal from the pivoted sections, contact the plane face in another supported state (as shown in FIG. 10).

Alternatively, the tablet display apparatus 6 can be totally reversely pivotally rotated around the first end section 11 of the support member 1. Then the support member 1 and the fixing seat 51 can be attached to the base seat 2 and the board body 3. In this case, the tablet display apparatus 6 is horizontally rested on the plane face with the screen facing upward in a ready state (as shown in FIG. 11).

Please refer to FIGS. 12 to 15, which show a second embodiment of the present invention. The second embodiment is derived from the first embodiment. According to the second embodiment, the present invention includes a connection assembly 7 and components of a board body 3, a base seat 2, an angle adjustment seat 4 and a support member 1, which are identical to those of the first embodiment. The connection assembly 7 includes a fixing seat 73, a retainer member 72 and a connection member 71. A center of the connection member 71 is formed with a hollow section 711 corresponding to the receiving section 21. An inner periphery of the hollow section 711 is formed with multiple locating recesses 712 arranged at predetermined angular intervals. The engagement locating members 24 can be engaged and located in the locating recesses 712. A first edge of the connection member 71 is formed with multiple first locating sections 713 extending in the same direction. (The first locating sections 713 can be hook sections). A second edge of the connection member 71 opposite to the first edge is formed with multiple second locating sections 714 extending in the same direction. The second locating sections 714 have hook structures. The second edge is further formed with a raised shift section 715 for shifting the second locating sections 714.

The retainer member 72 has an area larger than that of the hollow section 711 and is connected to one side of the connection member 71, which side is distal from the angle adjustment seat 4. The retainer member 72 covers the hollow section 711 to prevent the third pivot members 42, the elastic members 43 and the engagement locating members 44 from outward loosening and detaching from the angle adjustment seat L. Also, the retainer member 72 serves to connect the connection member 71 onto the angle adjustment seat 4, permitting the connection member 71 to be rotated relative to the angle adjustment seat 4.

One side of the fixing seat 73 is formed with a receiving space 731 for receiving a tablet display apparatus 6 (such as a tablet computer or a cellular phone). The periphery of the receiving space 731 is formed with a protruding holding section 732 for locating the tablet display apparatus 6. A first edge of the fixing seat 73 is formed with multiple first located sections 733 opposite to the receiving space 731, (which can be located guide slots). A second edge of the fixing seat 73 is formed with multiple second located sections 734 opposite to the receiving space 731, (which can be engagement guide slots). The first and second located sections 733, 734 correspond to the first and second locating sections 713, 714 of the connection member 71 respectively.

Figure 15:
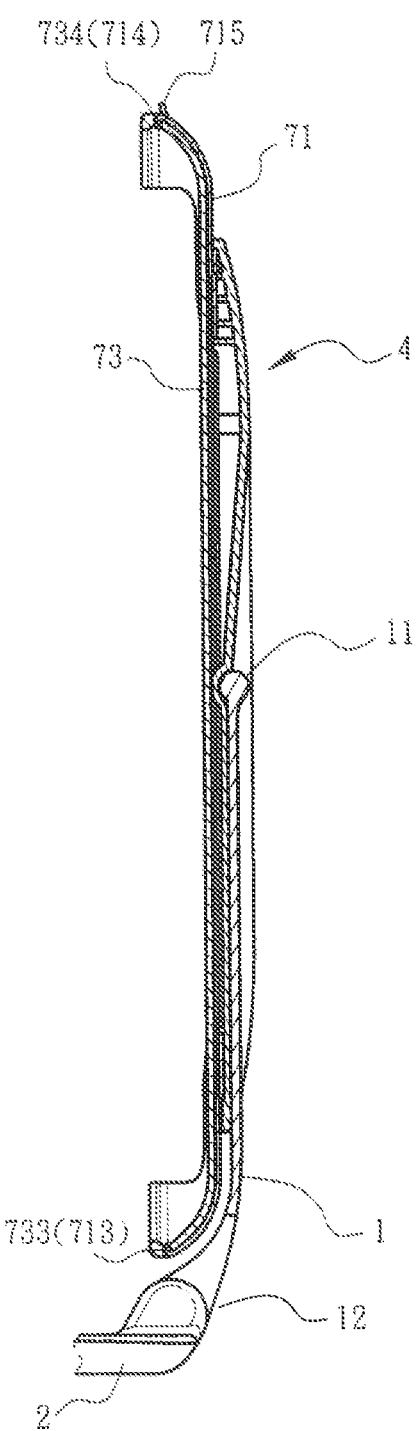
FIG. 15 is a sectional view of the second embodiment of the present invention, showing that the fixing seat is assembled with the connection member.
Figure 14:
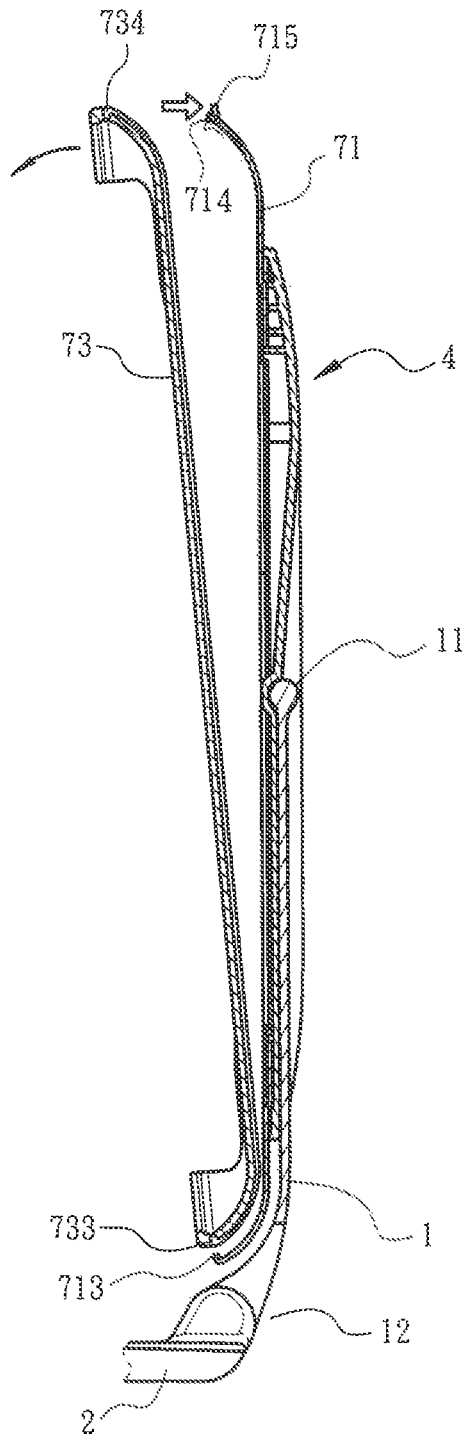
FIG. 14 is a sectional view of the second embodiment of the present invention, showing that the connection member is detached from the fixing seat.

When assembled, the first locating sections 713 (hook sections) of the connection member 71 extend into the first located sections 733 (located guide slots) of the fixing seat 73, while the second locating sections 714 (hook structures) on the other edge of the connection member 71 are cooperatively inserted into the second located sections 734 (engagement guide slots). Under such circumstance, the connection member 71 is connected with the fixing seat 73 (as shown in FIG. 15). A user can apply a force to the raised shift section 715 to disengage the second locating sections 714 (hook structures) from the second located sections 734 (engagement guide slots) so as to separate the fixing seat 73 from the connection member 71 (as shown in FIG. 14). Accordingly, the connection assembly 7 is easy to assemble and disassemble.

In the second embodiment, only the connection assembly 7 is different from that of the first embodiment in structure, while the board body 3, the angle adjustment seat 4, the base seat 2 and the support member 1 are identical to those components of the first embodiment in structure and connection manner and thus will not be repeatedly described hereinafter.

In conclusion, the multidirectional support structure for tablet display apparatus of the present invention is connectable with a keyboard and enables a user to adjustably tilt and rotate the screen of the tablet computer by different angles.

The above embodiments are only used to illustrate the present invention, not intended to limit the scope thereof. Many modifications of the above embodiments can be made without departing from the spirit of the present invention.

What is claimed is:

1. A multidirectional support structure for tablet display apparatus, comprising:
   a support member having a first end section and a second end section opposite to the first end section;
   a base seat pivotally connected to the second end section of the support member via a first pivot member; and
   a board body pivotally connected to one side of the base seat via a second pivot member, which side is distal from the support member, the first end section of the support member is connected with an angle adjustment seat and a connection assembly, the angle adjustment seat being pivotally connected with the first end section of the support member via at least one third pivot member, the angle adjustment seat having a receiving section, the connection assembly having a hollow section corresponding to the receiving section, the connection assembly having a fixing seat serving to connect with the tablet display apparatus and a connection member, the hollow section being formed on the connection member, a retainer member connecting the connection member to the angle adjustment seat, the fixing seat being detachably connected to the connection member.

2. The multidirectional support structure for tablet display apparatus as claimed in claim 1, wherein the angle adjustment seat is formed with the receiving section having an opening, at least one engagement locating member being disposed in the receiving section, the engagement locating member being constantly outward elastically pushed by a preset elastic member, the connection assembly being relatively rotatably connected to one side of the angle adjustment seat, which side is formed with the receiving section, an inner periphery of the hollow section being formed with multiple locating recesses for the engagement locating member to elastically engage in, the connection assembly being formed with a receiving space for receiving the tablet display apparatus.

3. The multidirectional support structure for tablet display apparatus as claimed in claim 2, wherein the receiving space is formed on the fixing seat.

4. The multidirectional support structure for tablet display apparatus as claimed in claim 3, wherein the connection assembly further includes said retainer member, the hollow section being formed on the fixing seat, the retainer member connecting the fixing seat to the angle adjustment seat.

5. The multidirectional support structure for tablet display apparatus as claimed in claim 4, wherein a first edge of the connection member is formed with at least one first locating section and a second edge of the connection member opposite to the first edge is formed with at least one second locating section, the fixing seat being formed with at least one first located section and at least one second located section corresponding to the first and second locating sections respectively.

6. The multidirectional support structure for tablet display apparatus as claimed in claim 5, wherein the first and second locating sections include a hook section and a hook structure respectively, while the first and second located sections are located guide slot and engagement guide slot respectively.

7. The multidirectional support structure for tablet display apparatus as claimed in claim 1, wherein at least one guide way is disposed on a periphery of the receiving section for guiding the engagement locating member to move along the guide way.

8. The multidirectional support structure for tablet display apparatus as claimed in claim 1, wherein a bottom side of the receiving section is formed with at least one passage in communication with a backside of the receiving section, the third pivot member being disposed in the receiving section, the third pivot member having a pivot end with pivotally locating function, the pivot end passing through the passage to connect with the first end section of the support member.

9. The multidirectional support structure for tablet display apparatus as claimed in claim 1, wherein the base seat is formed with a pivot dent for receiving the second end section of the support member, an outer periphery of the second end section being formed with an abutment section for abutting against a bottom face of the pivot dent in pivotal rotation of the support member.

10. The multidirectional support structure for tablet display apparatus as claimed in claim 1, wherein the board body is connected with multiple press keys to form a keyboard structure.

* * * * *